(12) United States Patent
An

(10) Patent No.: US 12,136,839 B2
(45) Date of Patent: Nov. 5, 2024

(54) PRE-CHARGE CIRCUIT AND BATTERY SYSTEM HAVING THE SAME

(71) Applicant: LG ENERGY SOLUTION, LTD., Seoul (KR)

(72) Inventor: Yangsoo An, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 455 days.

(21) Appl. No.: 17/608,029

(22) PCT Filed: Sep. 24, 2020

(86) PCT No.: PCT/KR2020/012971
§ 371 (c)(1),
(2) Date: Nov. 1, 2021

(87) PCT Pub. No.: WO2021/080198
PCT Pub. Date: Apr. 29, 2021

(65) Prior Publication Data
US 2022/0216702 A1    Jul. 7, 2022

(30) Foreign Application Priority Data

Oct. 21, 2019    (KR) .................. 10-2019-0130846

(51) Int. Cl.
*H02J 7/00*    (2006.01)
*H03K 17/687*    (2006.01)
(Continued)

(52) U.S. Cl.
CPC .......... *H02J 7/0029* (2013.01); *H02J 7/0063* (2013.01); *H02J 7/007* (2013.01);
(Continued)

(58) Field of Classification Search
CPC ........ H02J 7/007; H02J 7/0029; H02J 7/0063; H01M 10/46; H01M 10/441; H01M 10/425; H01M 2010/4271; H03K 17/6871
(Continued)

(56) References Cited

U.S. PATENT DOCUMENTS 10,029,572 B2    7/2018    Sakatani et al.
2007/0103194 A1    5/2007    Erstad
(Continued)

FOREIGN PATENT DOCUMENTS

CN    106564390 A    4/2017
CN    106611681 A    5/2017
(Continued)

OTHER PUBLICATIONS

International Search Report for PCT/KR2020/012971 mailed on Jan. 6, 2021.
(Continued)

*Primary Examiner* — Edward Tso
*Assistant Examiner* — Aaron Piggush
(74) *Attorney, Agent, or Firm* — Birch, Stewart, Kolasch & Birch, LLP

(57) ABSTRACT

Discussed is a pre-charge circuit and a battery system including the same, and the battery system includes: a battery pack configured to include a plurality of battery cells; a pre-charge relay configured to include a first MOSFET and a second MOSFET connected in series between a first electrode and an output terminal of the battery pack, a third MOSFET connected in parallel with the first MOSFET, and a fourth MOSFET connected in parallel with the second MOSFET; and a BMS configured to generate a gate voltage for controlling on and off of the relay.

10 Claims, 2 Drawing Sheets

(51) Int. Cl.
*H01M 10/42* (2006.01)
*H01M 10/44* (2006.01)
*H01M 10/46* (2006.01)

(52) U.S. Cl.
CPC ....... *H03K 17/6871* (2013.01); *H01M 10/425* (2013.01); *H01M 2010/4271* (2013.01); *H01M 10/441* (2013.01); *H01M 10/46* (2013.01)

(58) Field of Classification Search
USPC ........................................ 320/137, 158, 163
See application file for complete search history.

(56) References Cited

U.S. PATENT DOCUMENTS

| | | | |
|---|---|---|---|
| 2008/0048621 A1* | 2/2008 | Yun | H01M 10/482 320/136 |
| 2008/0106234 A1 | 5/2008 | Yun | |
| 2011/0065161 A1 | 3/2011 | Kwasinski et al. | |
| 2011/0316489 A1* | 12/2011 | Norimatsu | H02H 7/16 320/166 |
| 2012/0007547 A1 | 1/2012 | Kim | |
| 2012/0306264 A1* | 12/2012 | Komma | H03K 17/0814 307/9.1 |
| 2014/0062387 A1 | 3/2014 | Kim | |
| 2014/0266095 A1 | 9/2014 | Tokai | |
| 2015/0108340 A1 | 4/2015 | Kadoi et al. | |
| 2016/0352106 A1* | 12/2016 | Schimel | H02J 7/0031 |
| 2018/0026456 A1* | 1/2018 | Kang | H02J 7/0029 320/134 |
| 2019/0097438 A1* | 3/2019 | Song | H02J 7/00306 |
| 2019/0379217 A1 | 12/2019 | Song et al. | |

FOREIGN PATENT DOCUMENTS

| | | |
|---|---|---|
| DE | 10 2016 220 118 A1 | 8/2024 |
| JP | 2005-253206 A | 9/2005 |
| JP | 2006-208153 A | 8/2006 |
| JP | 2010-193588 A | 9/2010 |
| JP | 2013-183268 A | 9/2013 |
| JP | 2013-219428 A | 10/2013 |
| JP | 5834039 B2 | 12/2015 |
| JP | 2018-74753 A | 5/2018 |
| JP | 6367805 B2 | 8/2018 |
| KR | 10-2014-0028531 A | 3/2014 |
| KR | 10-2018-0023140 A | 3/2018 |
| KR | 10-2019-0004482 A | 1/2019 |
| KR | 10-2019-0034888 A | 4/2019 |
| KR | 10-2019-0034889 A | 4/2019 |
| KR | 10-2019-0066376 A | 6/2019 |
| WO | WO 2011/152086 A1 | 12/2011 |

OTHER PUBLICATIONS

Extended European Search Report for European Application No. 20879197.0, dated May 10, 2022.

* cited by examiner

PRE-CHARGE CIRCUIT AND BATTERY SYSTEM HAVING THE SAME

CROSS-REFERENCE WITH RELATED APPLICATION(S)

This application claims priority to and the benefit of Korean Patent Application No. 10-2019-0130846 filed in the Korean Intellectual Property Office on Oct. 21, 2019, the entire contents of which are incorporated herein by reference.

TECHNICAL FIELD

The present invention relates to a pre-charge circuit and a battery system including the same.

BACKGROUND ART

Recently, research on high-performance rechargeable batteries has been actively conducted as a demand for portable electronic products such as laptops and portable telephones increases, and development of electric vehicles such as HEVs (hybrid electric vehicles) and PEVs (pure electric vehicles), robots, satellites, etc., has begun in earnest.

As rechargeable batteries, various rechargeable batteries such as nickel cadmium batteries and nickel hydrogen batteries are commercially available, but lithium rechargeable batteries that are free to charge and discharge and having low self-discharge rates and high energy density are in the spotlight. Rechargeable batteries are often used in a battery pack state in which a plurality of rechargeable batteries are connected in series and/or parallel to provide a high-voltage and large-capacity power storage device.

A main relay may control electrical connection between a battery pack and an external device (e.g., a load or a charger) using a predetermined electrical signal. In many cases, the main relay is damaged due to an overcurrent (surge current) occurring during an initial driving period during which the battery pack and an external device are connected, and a pre-charge relay is used in parallel with the main relay in order to prevent such damage.

Meanwhile, in the case of configuring a relay using a semiconductor switching element such as a metal-oxide semiconductor field effect transistor (MOSFET), it must be switched to a predetermined state when a driving signal is received. However, the MOSFET used in the field often does not meet specifications of a standard breakdown voltage and an instantaneous allowable current due to various reasons such as a production process and storage conditions. MOSFETs that are out of the specifications of the standard breakdown voltage and the instantaneous allowable current will not function properly within the circuit.

For example, there are a pre-charge standard breakdown voltage and a pre-charge instantaneous allowable current required for the pre-charge relay, and the pre-charge relay may be configured with a plurality of MOSFETs in consideration of this. Actual performance of the MOSFET may not meet known specifications of the standard breakdown voltage and the instantaneous allowable current. In actual on/off control, the MOSFET is pointed out to have a problem because it cannot withstand the pre-charge standard breakdown voltage and the pre-charge instantaneous allowable current, and there is a possibility of a transient shock.

DISCLOSURE

Technical Problem

The present invention has been made in an effort to provide a pre-charge circuit with a low possibility of causing a transient shock, and a battery system including the same.

Technical Solution

An exemplary embodiment of the present invention provides a pre-charge circuit, including: a first MOSFET and a second MOSFET connected in series between a first electrode of a battery pack and an output terminal thereof; a third MOSFET connected in parallel with the first MOSFET; and a fourth MOSFET connected in parallel with the second MOSFET.

The pre-charge circuit may further include: a first resistor connected in parallel with a first end of the first MOSFET and a first end of the third MOSFET, and a second end of the first MOSFET and a second end of the third MOSFET; and a second resistor connected in parallel with a first end of the second MOSFET and a first end of the fourth MOSFET and a second end of the second MOSFET and a second end of the fourth MOSFET.

The first MOSFET, the second MOSFET, the third MOSFET, and the fourth MOSFET may be formed as P-type MOSFETs.

A drain terminal of the first MOSFET may be connected in series with a source terminal of the second MOSFET, a drain terminal of the third MOSFET may be connected in parallel with the drain terminal of the first MOSFET, and a source terminal of the fourth MOSFET may be connected in parallel with the source terminal of the second MOSFET.

An exemplary embodiment of the present invention provides a battery system including: a battery pack configured to include a plurality of battery cells; a pre-charge relay configured to include a first MOSFET and a second MOSFET connected in series between a first electrode and an output terminal of the battery pack, a third MOSFET connected in parallel with the first MOSFET, and a fourth MOSFET connected in parallel with the second MOSFET; and a BMS configured to generate a gate voltage for controlling on and off of the relay.

The pre-charge relay may further include: a first resistor connected in parallel with a first end of the first MOSFET and a first end of the third MOSFET, and a second end of the first MOSFET and a second end of the third MOSFET; and a second resistor connected in parallel with a first end of the second MOSFET and a first end of the fourth MOSFET and a second end of the second MOSFET and a second end of the fourth MOSFET.

The first MOSFET, the second MOSFET, the third MOSFET, and the fourth MOSFET may be formed as P-type MOSFETs.

A drain terminal of the first MOSFET may be connected in series with a source terminal of the second MOSFET, a drain terminal of the third MOSFET may be connected in parallel with the drain terminal of the first MOSFET, and a source terminal of the fourth MOSFET may be connected in parallel with the source terminal of the second MOSFET.

The BMS may receive a high level driving signal and may generate the gate voltage of a ground level to apply it to the first MOSFET, the second MOSFET, the third MOSFET, and the fourth MOSFET.

The battery system may further include a main relay configured to control electrical connection between the battery pack and an external device, the pre-charge relay may be turned on first before the main relay is turned on, and the main relay may be turned on and may be turned off after a predetermined time elapses.

Advantageous Effects

The present invention has an effect of providing a pre-charge relay capable of exerting a function even when some of the MOSFETs are outside specifications of pre-charge breakdown voltage and current.

The present invention has an effect of providing a pre-charge relay having high stability by distributing shock applied to a plurality of MOSFETs by including resistors connected in parallel with the MOSFETs connected in series and/or parallel.

The present invention has an effect of reducing an area of the gate driving circuit and reducing a cost by implementing a gate driving circuit in the form of a low side driver (LSD).

MODE FOR INVENTION

Figure 1:
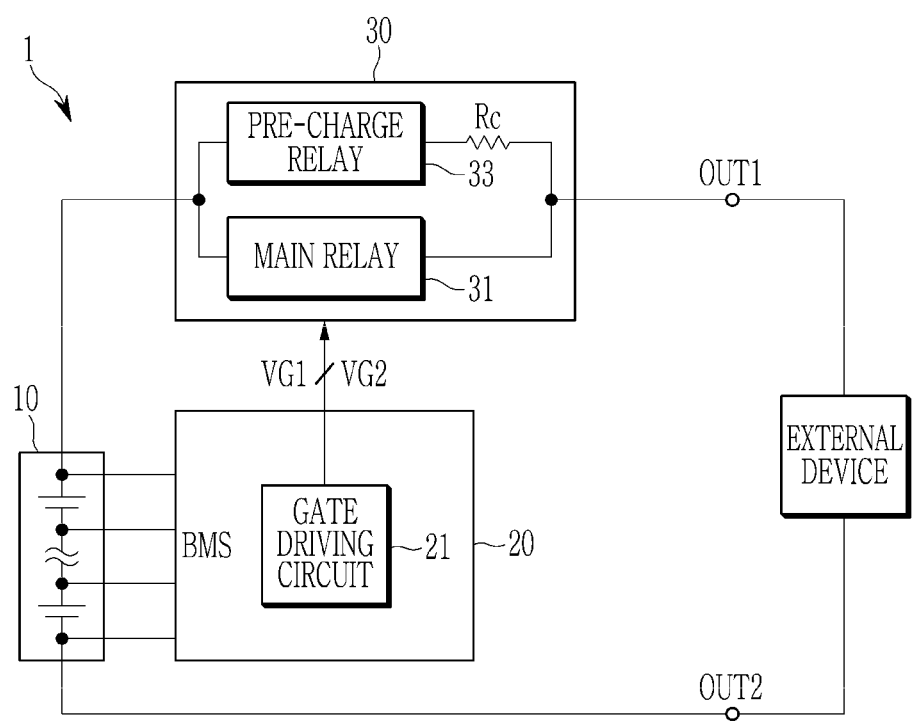
FIG. 1 illustrates a block diagram showing a battery system according to an exemplary embodiment.

Hereinafter, exemplary embodiments disclosed in the present specification will be described in detail with reference to the accompanying drawings. In the present specification, the same or similar components will be denoted by the same or similar reference numerals, and a repeated description thereof will be omitted. Terms "module" and/or "unit" for components used in the following description are used only in order to easily describe the specification. Therefore, these terms do not have meanings or roles that distinguish them from each other in and of themselves. In describing exemplary embodiments of the present specification, when it is determined that a detailed description of the well-known art associated with the present invention may obscure the gist of the present invention, it will be omitted. The accompanying drawings are provided only in order to allow exemplary embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to the other component or be connected or coupled to the other component with a further component intervening therebetween. On the other hand, it is to be understood that when one component is referred to as being "connected or coupled directly" to another component, it may be connected to or coupled to the other component without another component intervening therebetween.

It will be further understood that terms "comprise" or "have" used in the present specification specifies the presence of stated features, numerals, steps, operations, components, parts, or a combination thereof, but does not preclude the presence or addition of one or more other features, numerals, steps, operations, components, parts, or a combination thereof.

Figure 2:
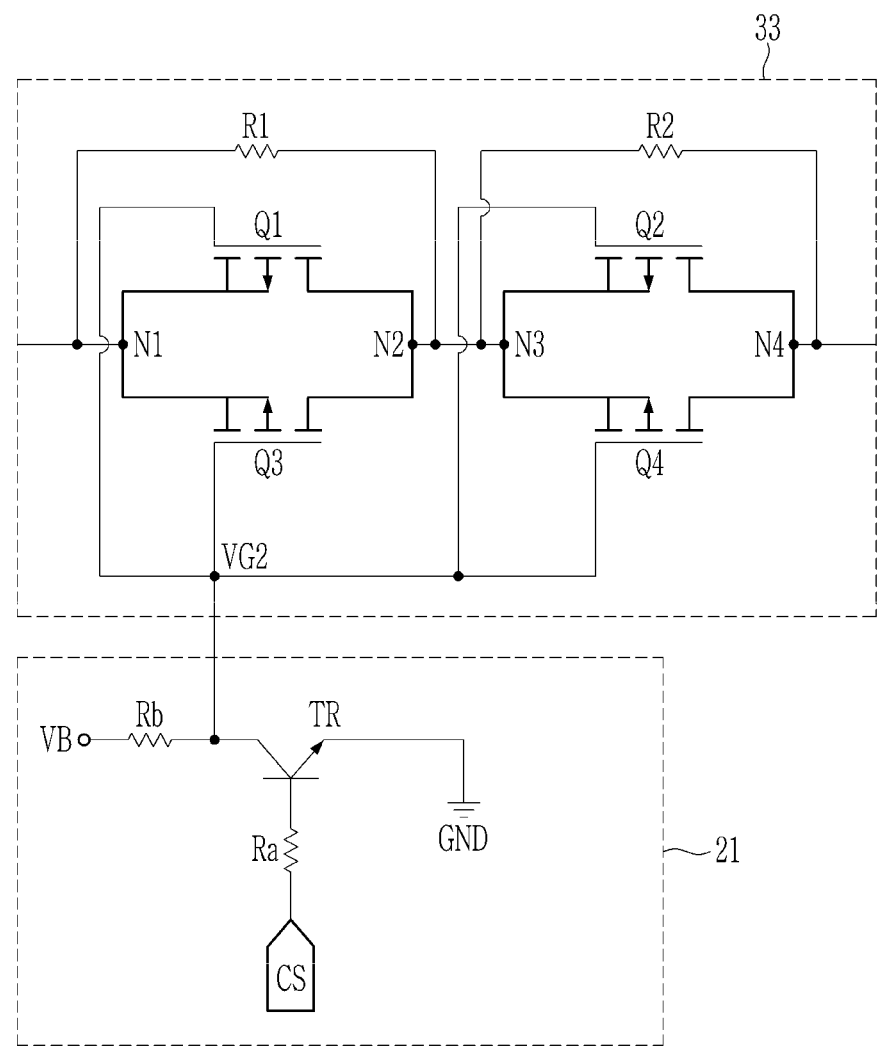
FIG. 2 illustrates a circuit diagram for describing a BMS and a pre-charge relay of FIG. 1.

FIG. 1 illustrates a block diagram showing a battery system according to an exemplary embodiment, and FIG. 2 illustrates a circuit diagram for describing a BMS and a pre-charge relay of FIG. 1.

As illustrated in FIG. 1, the battery system 1 includes a battery pack 10, a BMS 20, and a relay 30.

The battery pack 10 may supply necessary power by connecting a plurality of battery cells in series and/or parallel. In FIG. 1, the battery pack 10 includes a plurality of battery cells connected in series, is connected between two output terminals OUT1 and OUT2 of the battery system 1, and the relay 30 is connected between a positive electrode of the battery system 1 and the output terminal OUT1. The constituent elements illustrated in FIG. 1 and a connection relationship between the constituent elements are examples, and the present invention is not limited thereto.

The BMS 20 generates gate voltages VG1 and VG2 for controlling on/off of the relay 30 including a gate driving circuit 21. In FIG. 1, the BMS 20 is illustrated to include the gate driving circuit 21, but the present invention is not limited thereto, and the gate driving circuit 21 may be configured independently of the BMS 20.

Referring to FIG. 2, the gate drive circuit 21 may include a driving transistor TR. A base terminal of the driving transistor TR may receive a driving signal CS, and a collector terminal thereof may be connected to gate terminals of first, second, third, and fourth MOSFETs Q1, Q2, Q3, and Q4. The driving transistor TR, which is an NPN type of transistor, is turned on by a high-level driving signal CS and is turned off by a low-level driving signal CS. When the driving transistor TR is turned off, the gate driving circuit 21 applies a positive driving voltage VB capable of turning off a P-type MOSFET to first, second, third, and fourth MOSFETs Q1, Q2, Q3, and Q4.

The relay 30 may include a main relay 31 and a pre-charge relay 33 connected in parallel with the main relay 31. The relay 30 may be configured as an electronic relay including a semiconductor switching element. The semiconductor switching element may be a metal-oxide field effect transistor (MOSFET), but the present invention is not limited thereto.

The main relay 31 may be implemented as a MOSFET to be switched depending on a first gate voltage VG1 received from the BMS 20. The main relay 31 controls electrical connection between the battery system 1 and an external device (e.g., a load, charger). When the main relay 31 is turned on by the first gate voltage VG1 of an on level, the battery system 1 and the external device are electrically connected to perform charging or discharging. For example, when the external device is a load, a discharging operation in which power is supplied from the battery pack 10 to the load is performed, and when the external device is a charger, a charging operation in which the battery pack 10 is charged by the charger may be performed. When the main relay 31 is turned off by the first gate voltage VG1 of an off level, the battery system 1 and the external device are electrically separated from each other.

The pre-charge relay 33 may be implemented as a MOSFET to be switched depending on the second gate voltage VG2 received from the BMS 20, and may be connected in series with a pre-charge resistor RC. The pre-charge relay 33 may reduce a surge current, generated when the battery pack 10 is connected to an external device (for example, at the beginning of driving for charging or discharging), to prevent damage to the main relay 31 due to the surge current. For example, the pre-charge relay 33 may be turned on first before the main relay 31 is turned on, and the main relay 31 may be turned on and then turned off after a predetermined time elapses, thereby reducing the surge current.

Referring to FIG. 2, the pre-charge relay 33 includes the first, second, third, and fourth MOSFETs Q1, Q2, Q3, and Q4 and first and second resistors R1 and R2 connected in series and/or parallel.

The first MOSFET Q1 and the second MOSFET Q2 are connected in series between a first electrode and an output terminal of the battery pack 10, the third MOSFET Q3 is connected in parallel with the first MOSFET Q1, and the fourth MOSFET Q4 is connected in parallel with the second MOSFET Q2. The first resistor R1 is connected in parallel with a first end of the first MOSFET Q1 and a first end of the third MOSFET Q3, and a second end of the first MOSFET Q1 and a second end of the third MOSFET Q3. The second resistor R2 is connected in parallel with a first end of second MOSFET Q2, a first end of the fourth MOSFET Q4, and a second end of the second MOSFET Q2 and a second end of the fourth MOSFET Q4. In FIG. 2, the first, second, third, and fourth MOSFETs Q1, Q2, Q3, and Q4 are illustrated as P-type MOSFETs, but are not limited thereto, and may be implemented as other transistors that perform switching operations, such as N-type MOSFETs, BJTs, and IGBTs.

As illustrated in FIG. 2, contacts N1, N2, N3, and N4 are illustrated to describe a connection relationship between the first, second, third, and fourth MOSFETs Q1, Q2, Q3, and Q4 and the first and second resistors R1 and R2. The first node N1 is connected to a positive terminal of the battery pack 10, and the fourth node N4 is connected to the output terminal OUT1 illustrated in FIG. 1.

For example, a source terminal of the first MOSFET Q1 and a source terminal of the third MOSFET Q3 are connected to the first node N1, and a drain terminal of the first MOSFET Q1 and a drain terminal of the third MOSFET Q3 are connected to the second node N2. A first end of the first resistor R1 is connected to the first node N1, and a second end thereof is connected to the second node N2. A source terminal of the second MOSFET Q2 and a source terminal of the fourth MOSFET Q4 are connected to the third node N3, and a drain terminal of the second MOSFET Q2 and a drain terminal of the fourth MOSFET Q4 are connected to the fourth node N4. A first end of the second resistor R2 is connected to the third node N3, and a second end thereof is connected to the fourth node N4. Gate terminals of the first, second, third, and fourth MOSFETs Q1, Q2, Q3, and Q4 may all be connected to the collector terminal of the driving transistor TR, to be turned on or off in synchronization with the second gate voltage VG2.

The first, second, third, and fourth MOSFETs Q1, Q2, Q3, and Q4 may be turned on in synchronization with the second gate voltage VG2 of an on level. For example, when a base terminal of the driving transistor TR receives the high-level driving signal CS to be turned on, a collector terminal of the driving transistor TR is connected to a ground GND. A voltage of the ground GND is applied to the gate terminals of the first, second, third, and fourth MOSFETs Q1, Q2, Q3, and Q4 connected to the collector terminal of the driving transistor TR, and all of them are turned on. Herein, the gate driving circuit 21 may be implemented in the form of a low side driver (LSD) driven by connecting the first, second, third, and fourth MOSFETs Q1, Q2, Q3, and Q4 to the ground GND.

The first, second, third, and fourth MOSFETs Q1, Q2, Q3, and Q4 may be turned off in synchronization with the second gate voltage VG2 of an off level. For example, when the base terminal of the driving transistor TR receives the low-level driving signal CS, it is turned off, and the gate terminals of the first, second, third, and fourth MOSFETs Q1, Q2, Q3, and Q4 are all turned off by applying a positive driving voltage VB thereto.

Ideally, the first, second, third, and fourth MOSFETs Q1, Q2, Q3, and Q4 may be turned on in synchronization with the second gate voltage of an on level. However, a time difference may occur between actual turn-on times between the first, second, third, and fourth MOSFETs Q1, Q2, Q3, and Q4. In this case, an excessive voltage may be applied to the MOSFET that is turned on later.

For example, the pre-charge relay 33 may include the first, second, third, and fourth MOSFETs Q1, Q2, Q3, and Q4 connected in series and/or parallel without the first resistor R1 and the second resistor R2. In this case, when the third MOSFET Q3 is turned on later than the remaining first, second, and fourth MOSFETs Q1, Q2, and Q4, an excessive voltage may be applied to opposite ends of the third MOSFET Q3, resulting in shock, during a period corresponding to a difference in turn-on times between the third MOSFET Q3 and the remaining first, second, and fourth MOSFETs Q1, Q2, and Q4. Then, the third MOSFET Q3 may be damaged.

In order to prevent the above phenomenon, the first resistor R1 may be connected in parallel with the first MOSFET Q1 and the third MOSFET Q3, and the second resistor may be connected in parallel with the second MOSFET Q2 and the fourth MOSFET Q4. That is, even when transient shock exceeding limit specifications of the first MOSFET Q1 and the third MOSFET Q3 occurs at the beginning of driving, the first resistor R1 may prevent damage to the first MOSFET Q1 and the third MOSFET Q3 by distributing the transient shock. Even when transient shock exceeding limit specifications of the second MOSFET Q2 and the fourth MOSFET Q4 occurs at the beginning of driving, the second resistor R2 may prevent damage to the second MOSFET Q2 and the fourth MOSFET Q4 by distributing the transient shock.

In an exemplary embodiment, since the first resistor R1 and the second resistor R2 are connected in series between the battery pack 10 and the external device, there is a possibility that a leakage current occurs. To prevent this possibility, the first resistor R1 and the second resistor R2 are formed as resistors having very large resistance values. For example, the resistance values of the first resistor R1 and the second resistor R2 may be at least several mega-ohms (M) or more. Then, substantially no leakage current is generated between the battery pack 10 and the external device regardless of switching states of the pre-charge relay 33 and the main relay 31.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A pre-charge circuit for a battery pack, the pre-charge circuit comprising:

a first metal-oxide field effect transistor (MOSFET) and a second MOSFET connected in series between a first electrode of the battery pack and an output terminal thereof;

a third MOSFET connected in parallel with the first MOSFET;

a fourth MOSFET connected in parallel with the second MOSFET;

a first resistor connected in parallel to the first MOSFET and the third MOSFET; and a second resistor connected in parallel to the second MOSFET and the fourth MOSFET, wherein a first end of the first resistor is connected to first ends of the first MOSFET and the third MOSFET at a first node, and a second end of the first resistor is connected to second ends of the first MOSFET and the third MOSFET at a second node, wherein a first end of the second resistor is connected to first ends of the second MOSFET and the fourth MOSFET at a third node, and a second end of the second resistor is connected to second ends of the second MOSFET and the fourth MOSFET at a fourth node, wherein the first resistor and the second resistor are connected in series by being connected to a wire directly connecting the second node to the third node.

2. The pre-charge circuit of claim 1, wherein the first MOSFET, the second MOSFET, the third MOSFET, and the fourth MOSFET are formed as P-type MOSFETs.

3. The pre-charge circuit of claim 2, wherein a drain terminal of the first MOSFET is connected in series with a source terminal of the second MOSFET, a drain terminal of the third MOSFET is connected in parallel with the drain terminal of the first MOSFET, and a source terminal of the fourth MOSFET is connected in parallel with the source terminal of the second MOSFET.

4. The pre-charge circuit of claim 1, wherein a gate voltage of an on level or an off level is synchronously applied to gate terminals of the first, second, third, and fourth MOSFETs to synchronously turn on or turn off, respectively, the first, second, third, and fourth MOSFETs.

5. A battery system comprising:
a battery pack configured to include a plurality of battery cells;
a pre-charge relay configured to include a first metal-oxide field effect transistor (MOSFET) and a second MOSFET connected in series between a first electrode and an output terminal of the battery pack, a third MOSFET connected in parallel with the first MOSFET, a fourth MOSFET connected in parallel with the second MOSFET, a first resistor connected in parallel to the first MOSFET and the third MOSFET, and a second resistor connected in parallel to the second MOSFET and the fourth MOSFET; and
a battery management system (BMS) configured to generate a gate voltage for controlling on and off of the pre-charge relay, wherein a first end of the first resistor is connected to first ends of the first MOSFET and the third MOSFET at a first node, and a second end of the first resistor is connected to second ends of the first MOSFET and the third MOSFET at a second node, and wherein a first end of the second resistor is connected to first ends of the second MOSFET and the fourth MOSFET at a third node, and a second end of the second resistor is connected to second ends of the second MOSFET and the fourth MOSFET at a fourth node, wherein the first resistor and the second resistor are connected in series by being connected to a wire directly connecting the second node to the third node.

6. The battery system of claim 5, wherein the first MOSFET, the second MOSFET, the third MOSFET, and the fourth MOSFET are formed as P-type MOSFETs.

7. The battery system of claim 6, wherein a drain terminal of the first MOSFET is connected in series with a source terminal of the second MOSFET, a drain terminal of the third MOSFET is connected in parallel with the drain terminal of the first MOSFET, and a source terminal of the fourth MOSFET is connected in parallel with the source terminal of the second MOSFET.

8. The battery system of claim 7, wherein the BMS receives a high level driving signal and generates the gate voltage of a ground level to apply it to the first MOSFET, the second MOSFET, the third MOSFET, and the fourth MOSFET.

9. The battery system of claim 5, further comprising a main relay configured to control electrical connection between the battery pack and an external device,
wherein the pre-charge relay is turned on first before the main relay is turned on, and the main relay is turned on and is turned off after a predetermined time elapses.

10. The battery system of claim 5, wherein the gate voltage of an on level or an off level is synchronously applied to gate terminals of the first, second, third, and fourth MOSFETs to synchronously turn on or turn off, respectively, the first, second, third, and fourth MOSFETs.

* * * * *